United States Patent
Lin et al.

[11] Patent Number: 6,086,951
[45] Date of Patent: Jul. 11, 2000

[54] METHOD FOR FORMING METALLIC CAPACITOR

[75] Inventors: Chen-Bin Lin, Taipei; Cheng-Hui Chung, Hsinchu Hsien; Yu-Ju Liu, Hsinchu, all of Taiwan

[73] Assignee: United Microelectronics Corp., Hsinchu, Taiwan

[21] Appl. No.: 09/332,342

[22] Filed: Jun. 14, 1999

[51] Int. Cl.$^7$ .................................. H01L 21/8242
[52] U.S. Cl. ................... 427/253; 438/396; 438/629; 427/79
[58] Field of Search ................ 427/79–81; 438/253, 438/396, 629

[56] References Cited

U.S. PATENT DOCUMENTS 4,436,766  3/1984  Williams .................................. 427/79
5,057,447  10/1991  Paterson .................................. 437/43

*Primary Examiner*—Brian K. Talbot
*Attorney, Agent, or Firm*—Thomas, Kayden, Horstemeyer & Risley

[57] ABSTRACT

A method of forming metallic capacitor. The method includes forming a lower electrode for forming the capacitor and a metal conductive line over an inter-layer dielectric such that there are gaps between and on the sides of the lower electrode and the metal conductive line. Thereafter, a first oxide layer is formed that fills the gap, and then a second oxide layer is formed over the inter-layer dielectric. The second oxide layer is later patterned to form a cap oxide layer having an opening that exposes a portion of the lower electrode. Subsequently, a thin dielectric layer is formed over the lower electrode and the cap oxide layer. Finally, an upper electrode is formed over the thin dielectric layer filling the opening.

20 Claims, 2 Drawing Sheets

«6,086,951»

METHOD FOR FORMING METALLIC CAPACITOR

BACKGROUND OF THE INVENTION

1. Field of Invention

The present invention relates to a method of manufacturing a semiconductor device. More particularly, the present invention relates to a method for forming a metallic capacitor.

2. Description of Related Art

Polysilicon material is often used to fabricate capacitors in the manufacturing of conventional semiconductor devices. Polysilicon material is quite often used in the production of capacitors in the analog region of an integrated circuit where a host of other signal-producing devices also needs to be produced. In general, two polysilicon layers are required to form a capacitor.

One problem facing the production of a polysilicon capacitor is that the capacitance of a capacitor may differ considerably from place to place, and it is very difficult to achieve high uniformity. Since stability of capacitor capacitance is very important, particularly in the analog portion of an integrated circuit, the polysilicon capacitor is not an ideal design. In addition, polysilicon capacitor process is quite sensitive to processing parameters and external conditions. Hence, the stability of a capacitor is compromised even further.

Another problem facing polysilicon capacitor production is that many steps are required to produce a polysilicon capacitor and the process involves the use of a sophisticated control mechanism. Operations such as heating, doping and integrating demand considerable processing care. Therefore, a polysilicon capacitor is more costly to produce than a metallic capacitor.

SUMMARY OF THE INVENTION

The invention provides a method of forming a metallic capacitor. The method includes forming a patterned metallic layer over an inter-layer dielectric. The patterned metallic layer actually comprises a lower electrode for forming the capacitor and a metal conductive line. Furthermore, there are gaps between the lower electrode and the metal conductive line. Thereafter, a first oxide layer is formed that fills the gaps, and then a second oxide layer is formed over the metal conductive line, the first oxide layer and the lower electrode. The second oxide layer has an opening that exposes a portion of the lower electrode. Subsequently, a thin dielectric layer is formed over the lower electrode and the second oxide layer. Finally, an upper electrode is formed over the thin dielectric layer to establish a metal capacitor.

The characteristics of this invention include the use of metallic material to form the electrodes of a capacitor instead of polysilicon and the formation of the lower electrode of a capacitor and the metal conductive line in the same operation. In addition, a cap oxide layer is used as a protective/buffer layer for the metal conductive line so that damages to the metal conductive line due to etching are reduced considerably.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
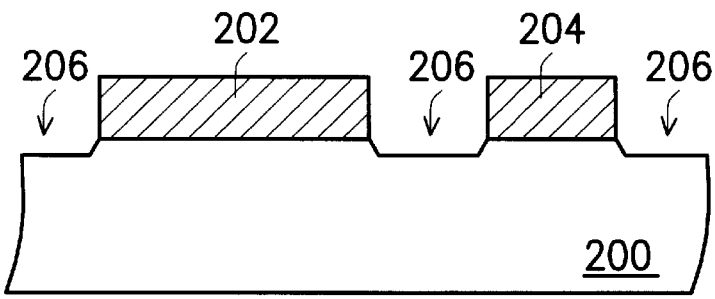
FIGS. 1A through 1F are schematic, cross-sectional views showing the progression of steps for fabricating a metallic capacitor according to one embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1F are schematic, cross-sectional views showing the progression of steps for fabricating a metallic capacitor according to one embodiment of this invention.

As shown in FIG. 1A, a lower electrode 202 for the capacitor and a metal conductive line 204 are simultaneously formed over an inter-layer dielectric (ILD) 200 in a single operation. The lower electrode 202 and the metal conductive line 204 are formed, for example, by depositing a layer of metal over the ILD 200, and then performing photolithographic and etching operations. There are gaps 206 between the metal conductive line 204 and the lower electrode 202 as well as on their sides. In FIG. 1A, some recessed regions due to over-etching are also shown. However, these recesses will not affect subsequent operations of this invention.

Figure 1B:
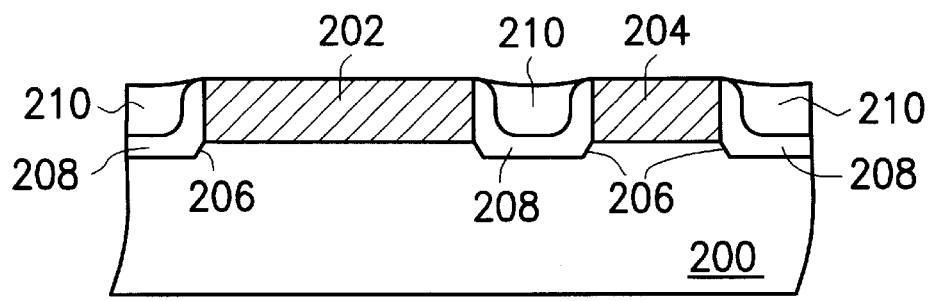

As shown in FIG. 1B, oxide material is deposited into the gaps 206. The oxide layer comprises a thin layer of oxide 208 that is conformal to the outline of the gaps 206 and a spin-on-glass (SOG) layer 210. The oxide layer is formed by depositing oxide material over the exposed surface of the gap 206 so that a thin conformal oxide layer 208 is formed, and then forming a spin-on-glass layer 210 over the thin oxide layer 208. The thin oxide layer 208 can be formed using a plasma-enhanced chemical vapor deposition (PECVD) method, for example.

Figure 1C:
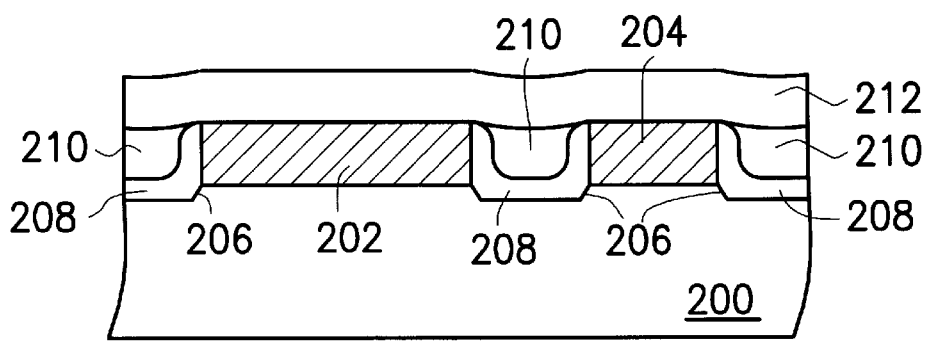

As shown in FIG. 1C, another oxide layer 212 is formed over the ILD 200 using, for example, a deposition method. The oxide layer 212 has a thickness that ranges from several hundred to a few thousand angstroms, but preferably has a thickness of about 1000 Å.

Figure 1D:
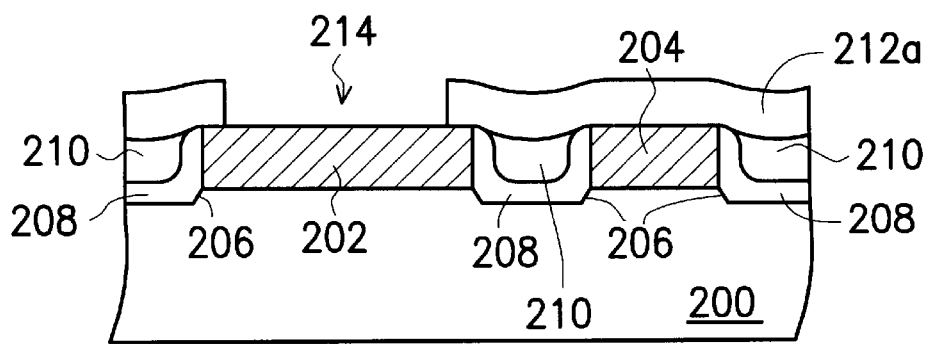

As shown in FIG. 1D, an area for forming the upper electrode region is patterned using photolithographic and etching techniques. In other words, the oxide layer 212 (shown in FIG. 1C) is patterned. The patterned oxide layer 212 becomes a cap oxide layer 212*a* that covers regions outside the lower electrode 202, and especially the metal conductive line 204. Since the cap oxide layer 212*a* does not cover the lower electrode 202, an opening 214 is formed. The opening 214 is used to house the dielectric film layer of the capacitor and the upper electrode above the lower electrode 202.

Figure 1E:
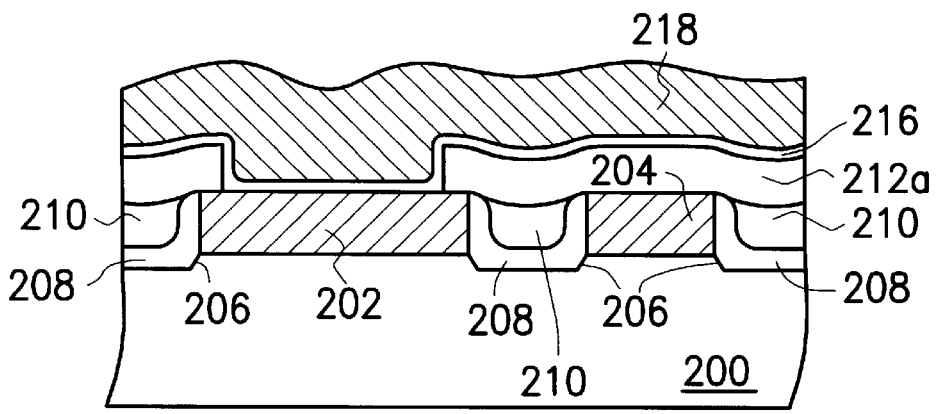

As shown in FIG. 1E, a thin dielectric layer 216 and a metallic layer 218 are sequentially formed over the cap oxide layer 212*a* and the lower electrode 202. The metallic layer 218 completely fills the opening 214 (as shown in FIG. 1D) and covers the cap oxide layer 212*a*. The metallic layer 218 can be formed using tungsten or aluminum in a chemical vapor deposition (CVD) process, for example.

Figure 1F:
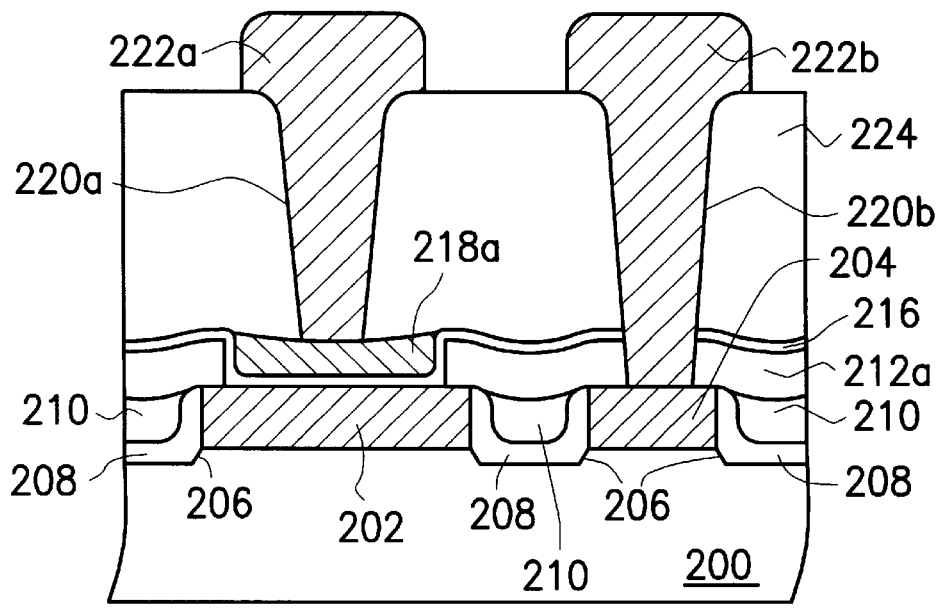

As shown in FIG. 1F, the metallic layer 218 (as shown in FIG. 1E) is etched back to form a metal plug inside the opening 214. The metal plug serves as an upper electrode 218a. If the metallic layer 218 is a tungsten layer, chemical-mechanical polishing can be used. Thereafter, an inter-metal dielectric (IMD) 224 having a first opening 220a and a second opening 220b is formed on top of the upper electrode 218a and the thin dielectric layer 216. The first opening 220a exposes a portion of the upper electrode 218, whereas the second opening 220b exposes a portion of the metal conductive line 204. Subsequently, metallic material is deposited over the IMD 224 as well as into the first opening 220a and the second opening 220b. Then, the metallic layer is patterned to form metallic via plugs 222a and 222b, thereby forming the necessary interconnecting metallic lines. The metallic via plug 222a is above the upper electrode 218, while the metallic via plug 222b is formed above the metal conductive line 204.

Figure 2:
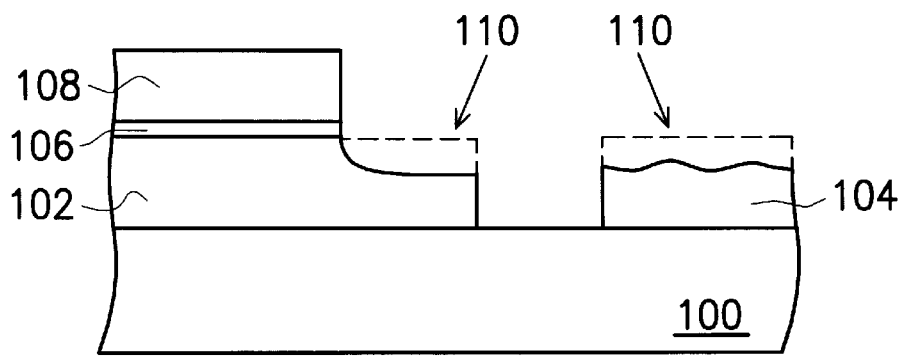
FIG. 2 illustrates the resulting configuration of the metallic capacitor when the step of forming the cap oxide layer according to this invention is skipped.

However, if the step of forming the cap oxide layer 212a is skipped, the resulting configuration is shown in FIG. 2. In FIG. 2, the structure includes a dielectric layer 100 as well as a metal conductive line 104, a lower electrode 102, a dielectric layer 106 for the capacitor and a metallic upper electrode 108. The two metallic electrodes 102 and 108 together with the dielectric layer 106 in the middle form a metallic capacitor. The lower electrode 102 and the metal conductive line 104 can be formed in the same processing operation. The dash line portion 110 shows the original outline for the metal conductive line 104 and the lower electrode 102. However, because some over-etching may occur when the upper electrode 108 is patterned, a portion of the dielectric layer 106, the lower electrode 102, and the metal conductive line 104 may be etched away, causing some permanent damage. Hence, performance of the metal conductive line 104 may be affected.

The additional cap oxide layer provides some buffering and protection for the metal conductive line. Ultimately, damages to the metal conductive line are prevented.

Furthermore, the method of this invention can be applied to form capacitors in the analog portion of a mixed mode circuit.

In summary, the advantages of the invention include:
1. Since metallic material is used to form the electrodes of a capacitor, there is no need to form polysilicon electrodes using complicated procedures.
2. The lower electrode of the capacitor as well as the metal conductive line can be formed in the same processing operation.
3. The formation of a cap oxide layer as a protective/buffer layer over a metal conductive line is able to prevent any damage due to etching.
4. Unwanted damage to the dielectric layer is prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a metallic capacitor, comprising the steps of:
   forming a patterned metallic layer over an inter-layer dielectric, wherein the patterned metallic layer is composed of the lower electrode of a capacitor and a metal conductive line, and there are gaps that expose a portion of the inter-layer dielectric between the lower electrode and the metal conductive line;
   depositing oxide material to fill the gaps, and thus forming a first oxide layer;
   forming a second oxide layer over the metal conductive line, the first oxide layer and the lower electrode, such that the second oxide layer also has an opening that exposes a portion of the lower electrode;
   forming a thin dielectric film over the lower electrode and the second oxide layer; and
   forming the upper electrode of a capacitor over the thin dielectric film.

2. The method of claim 1, wherein the second oxide layer has a thickness of between 100 Å and 9999 Å.

3. The method of claim 1, wherein the second oxide layer has a thickness of about 1000 Å.

4. The method of claim 1, wherein the first oxide layer includes a thin oxide layer and a spin-on-glass layer.

5. The method of claim 4, wherein the step of forming the first oxide layer includes the steps of:
   forming a thin oxide layer over the exposed surfaces of the gap; and
   forming a spin-on-glass layer over the thin oxide layer such that the gap is filled.

6. The method of claim 1, wherein the material for forming the upper electrode of the capacitor includes aluminum.

7. The method of claim 1, wherein the material for forming the upper electrode of the capacitor includes tungsten.

8. The method of claim 1, wherein after the step of forming the upper electrode of the capacitor, further includes forming a via plug above the upper electrode.

9. A method for forming metallic interconnects, comprising the steps of:
   providing an inter-layer dielectric having a lower electrode of a capacitor and a metal conductive line thereon such that there are gaps that expose a portion of the inter-layer dielectric between the lower electrode and the metal conductive line;
   depositing oxide material to fill the gaps, and thus forming a first oxide layer;
   forming a second oxide layer over the metal conductive line, the first oxide layer and the lower electrode such that the second oxide layer also has an opening that exposes a portion of the lower electrode;
   forming a thin dielectric film over the lower electrode and the second oxide layer;
   forming the upper electrode of a capacitor over the thin dielectric film; and
   forming a via plug above the upper electrode of the capacitor.

10. The method of claim 9, wherein the second oxide layer has a thickness of between 100 Å and 9999 Å.

11. The method of claim 9, wherein the second oxide layer has a thickness of about 1000 Å.

12. The method of claim 9, wherein the first oxide layer includes a thin oxide layer and a spin-on-glass layer.

13. The method of claim 12, wherein the step of forming the first oxide layer includes the steps of:
   forming a thin oxide layer over the exposed surfaces of the gap; and
   forming a spin-on-glass layer over the thin oxide layer such that the gap is filled.

14. The method of claim 9, wherein the material for forming the upper electrode of the capacitor includes aluminum.

15. The method of claim 9, wherein the material for forming the upper electrode of the capacitor includes tungsten.

16. The method of claim 9, wherein after the step of forming the upper electrode of the capacitor, further includes forming a via plug above the metal conductive line.

17. A method of forming metallic capacitor suitable for producing capacitor in an analog portion of a mixed mode circuit, comprising the steps of:

provising an inter-layer dielectric;

forming the lower electrode of the capacitor and a metal conductive line over an inter-layer dielectric such that there are gaps that expose a portion of the inter-layer dielectric between the lower electrode and the metal conductive line;

depositing oxide material to fill the gaps, and thus forming a first oxide layer;

forming a second oxide layer over the metal conductive line, the first oxide layer and the lower electrode such that the second oxide layer also has an opening that exposes a portion of the lower electrode;

forming a thin dielectric film over the lower electrode and the second oxide layer; and forming the upper electrode of a capacitor over the thin dielectric film.

18. The method of claim 17, wherein the second oxide layer has a thickness of between 100 Å and 9999 Å.

19. The method of claim 17, wherein the second oxide layer has a thickness of about 1000 Å.

20. The method of claim 17, wherein the first oxide layer includes a thin oxide layer and a spin-on-glass layer.

* * * * *